(12) United States Patent
Wang et al.

(10) Patent No.: US 7,863,944 B2
(45) Date of Patent: Jan. 4, 2011

(54) PASSIVE CLOCK DETECTOR

(75) Inventors: Zhengyu Wang, Plano, TX (US); Milad Alwardi, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 12/400,909

(22) Filed: Mar. 10, 2009

(65) Prior Publication Data
US 2010/0231264 A1   Sep. 16, 2010

(51) Int. Cl.
*H03K 5/00* (2006.01)
(52) U.S. Cl. .......................................... 327/97; 327/64
(58) Field of Classification Search .................... 327/12, 327/64, 90, 97, 98
See application file for complete search history.

(56) References Cited

U.S. PATENT DOCUMENTS

| 6,218,893 B1 | 4/2001 | Noguchi |
| 2007/0152716 A1 | 7/2007 | Kuo et al. |

*Primary Examiner*—Lincoln Donovan
*Assistant Examiner*—William Hernandez
(74) *Attorney, Agent, or Firm*—John J. Patti; Wade J. Brady, III; Frederick J. Telecky, Jr.

(57) ABSTRACT

A clock detector is provided. The clock detector generally comprises a filter, a first branch, a second branch, a latch, and logic. The filter is adapted to receive a clock signal and is coupled to a low threshold inverter in the first branch and a high threshold inverter in the second branch. The latch is adapted to receive the clock signal and is coupled to the first branch, while the logic is coupled to the node between the first branch and the latch, an output of the latch, and the second branch so that it can output a clock detection signal.

14 Claims, 4 Drawing Sheets

PASSIVE CLOCK DETECTOR

TECHNICAL FIELD

The invention relates generally to detection of a clock signal and, more particularly, to passive detection of a clock signal.

BACKGROUND

In conventional systems, power savings or "sleep" modes are commonly used. Generally, when systems enter a sleep mode, its clock signal frequencies are reduced to a lower frequency or converted to a DC signal. In many of these systems, clock detectors are employed to determine when a system is in an active mode or in a sleep mode by monitoring the clock signal. Some examples of conventional clock detectors are U.S. Pat. No. 6,218,893 and U.S. Patent Pre-Grant Publ. No. 2007/0152716.

SUMMARY

A preferred embodiment of the present invention, accordingly, provides an apparatus. The apparatus comprises a filter that is adapted to receive a clock signal; a first branch that is coupled to the filter, wherein the first branch includes a low threshold inverter; a second branch that is coupled to the filter, wherein the second branch includes a high threshold inverter; a latch that is adapted to receive the clock signal and that is coupled to the first branch; and logic that is coupled to the node between the first branch and the latch, an output of the latch, and the second branch, wherein the logic is adapted to output a clock detection signal.

In accordance with a preferred embodiment of the present invention, the filter further comprises a low pass filter.

In accordance with a preferred embodiment of the present invention, the low threshold inverter further comprises a PMOS FET having an aspect ratio of 0.8/4, wherein the PMOS FET is adapted to receives an input at its gate and to provide an output at its drain; and an NMOS FET having an aspect ratio of 4/0.4, wherein the gate of the NMOS FET is coupled to the gate of the PMOS FET, and wherein the drain of the NMOS FET is coupled to the drain of the PMOS FET.

In accordance with a preferred embodiment of the present invention, the high threshold inverter further comprises a PMOS FET having an aspect ratio of 8/0.4, wherein the PMOS FET is adapted to receives an input at its gate and to provide an output at its drain; and an NMOS FET having an aspect ratio of 0.8/4, wherein the gate of the NMOS FET is coupled to the gate of the PMOS FET, and wherein the drain of the NMOS FET is coupled to the drain of the PMOS FET.

In accordance with a preferred embodiment of the present invention, the first branch includes a delay circuit that is coupled between the low threshold inverter and the latch.

In accordance with a preferred embodiment of the present invention, the latch further comprises a D flip-flop.

In accordance with a preferred embodiment of the present invention, the logic further comprises an AND gate.

In accordance with a preferred embodiment of the present invention, an apparatus is provided. The apparatus comprises a low pass filter that is adapted to receive a clock signal; a low threshold inverter that is coupled to the filter; a delay circuit that is coupled to the low threshold inverter; a high threshold inverter that is coupled the filter; a latch that is adapted to receive the clock signal and that is coupled to the delay circuit; and logic that is coupled to an output of the latch, the delay circuit, and the high threshold inverter, wherein the logic is adapted to output a clock detection signal.

In accordance with a preferred embodiment of the present invention, the low pass filter further comprises a resistor having a value of about 2 MΩ that is adapted to receive the clock signal; and a capacitor that is coupled between the resistor and ground, wherein the capacitor has a value of about 1 pF.

In accordance with a preferred embodiment of the present invention, the delay circuit further comprises a plurality of inverters coupled in series with one another.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
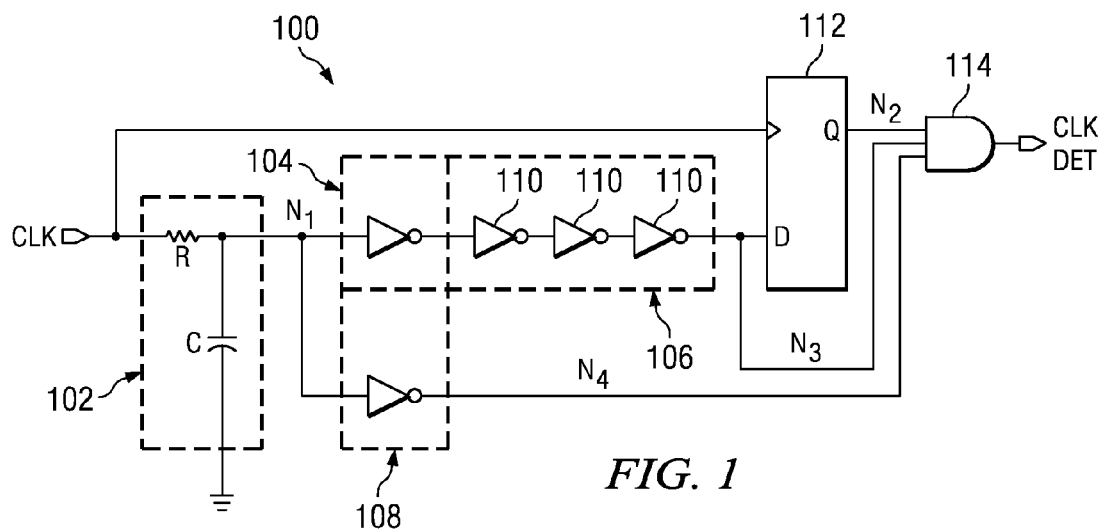
FIG. 1 is a circuit diagram of the passive clock detector in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a passive clock detector in accordance with a preferred embodiment of the present invention. The clock detector 100 generally comprises a filter 102, a first branch, a second branch, a latch 112, and logic 114. Preferably, the first branch comprises a low threshold inverter 104 coupled in series with a delay circuit 106 (which is generally comprised of several inverters 110 coupled in series with one another), and the second branch generally comprises a high threshold inverter 108.

In operation, the clock signal CLK is filtered by filter 102. Filter 102 is preferably a low pass filter that is generally comprised of a resistor R (preferably having a value of about 2 MΩ) and a capacitor C (preferably having a value of about 1 pF). This filtered clock signal (which is the extraction of the DC component of the clock signal CLK) is output to each of the first and second branches at node N₁. Depending on the voltage level at node N₁, the first and/or second branches can be activated because the high and low threshold inverters 108 and 104 can trigger at different levels. Under circumstances where the first branch is active, the signal propagates through the delay 106 to the latch 112 (which is preferably a D-type flip-flop or D flip-flop) that is clocked by the clock signal CLK. Based on the outputs of the first branch, the second branch, and the latch 112, the logic 114 (preferably, an AND gate) can output the clock detection signal CLKDET.

Figure 2:
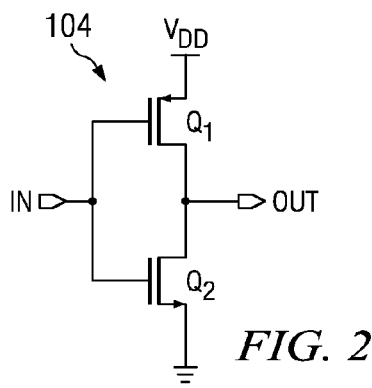
FIG. 2 is a circuit diagram of the low threshold inverter of FIG. 1 in accordance with a preferred embodiment of the present invention.
Figure 3:
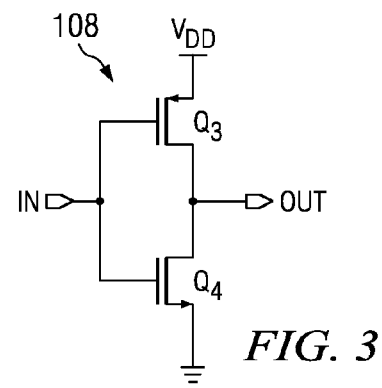
FIG. 3 is a circuit diagram of the high threshold inverter of FIG. 1 in accordance with a preferred embodiment of the present invention.

Turning to FIGS. 2 and 3, the high and low threshold inverters 108 and 104 can be seen in greater detail. Each of inverters 104 and 108 is comprised of a PMOS FET $Q_1$ and $Q_3$ (respectively) and an NMOS FET $Q_2$ and $Q_4$ (respectively) that are arranged as a conventional CMOS inverter. A difference between inverters 104 and 108 is the different aspect ratios of the respective FETs. Preferably, FETs $Q_1$ through $Q_4$ have the following (respective) aspect ratios (width/length): 0.8/4; 4/0.4; 8/0.4; and 0.8/4. By having these different aspect ratios, inverters 104 and 108 have different triggering thresholds. The use of the inverters 104 and 108 generally allows the detector 100 to generate a desired clock detection signal CLKDET, passively and without substantial power consumption.

Figure 4:
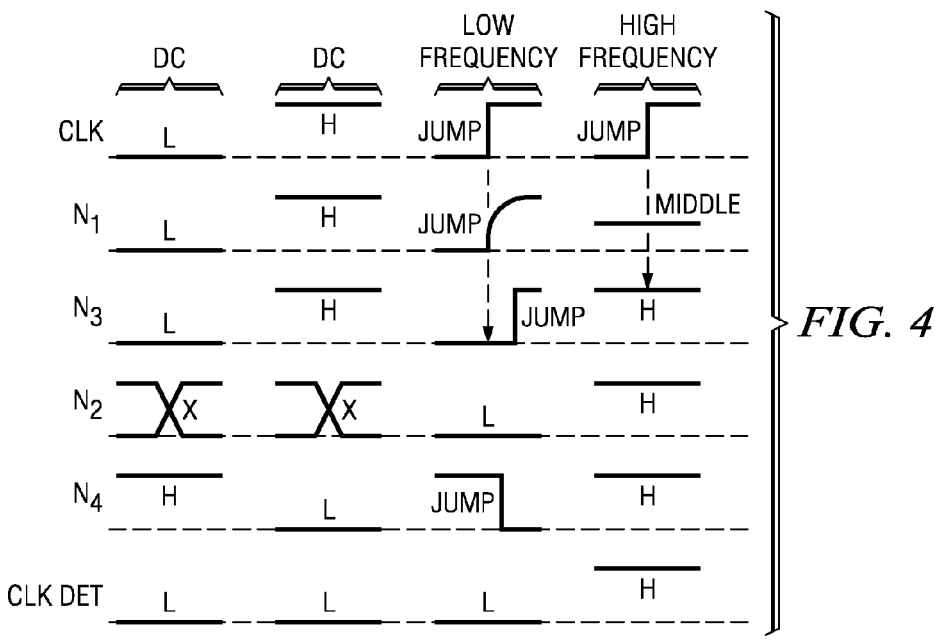
FIG. 4 is logic diagram depicting the general operation of the passive clock detector of FIG. 1.

Now, turning FIG. 4, the logic levels at nodes $N_1$ through $N_4$ and the clock detection signal CLKDET can be seen based on the clock signal CLK. For the clock signal CLK at a constant DC level, be it logic high or logic low, the clock detection signal CLKDET is logic low, indicating that no clock signal is detected. For a low frequency clock signal CLK, both high threshold inverter 108 and low threshold inverter 104 are able to switch with the clock signal CLK, but since node $N_3$ is the delayed version of the clock signal CLK, the latch 114 samples at logic low, and its output remains at logic low (node $N_2$), resulting in the clock detection signal CLKDET being logic low. For high frequency clock signal CLK, the output of low pass filter 102 (node $N_1$) remains in the middle level, the output of high threshold inverter 108 will be maintained at logic high (node $N_4$), the output of low threshold inverter 104 will be maintained at logic low, which causes both the latch 112 input (node $N_3$) and output (node $N_2$) to be logic high. Therefore, for a high frequency clock signal CLK nodes $N_2$, $N_3$ and $N_4$ are all logic high which results in the clock detection signal CLKDET being logic high, indicating a clock signal CLK at a desired (high) frequency has been detected. Therefore, detector 100 is able to indicate when a system is in an active mode or in a sleep mode.

Figure 5:
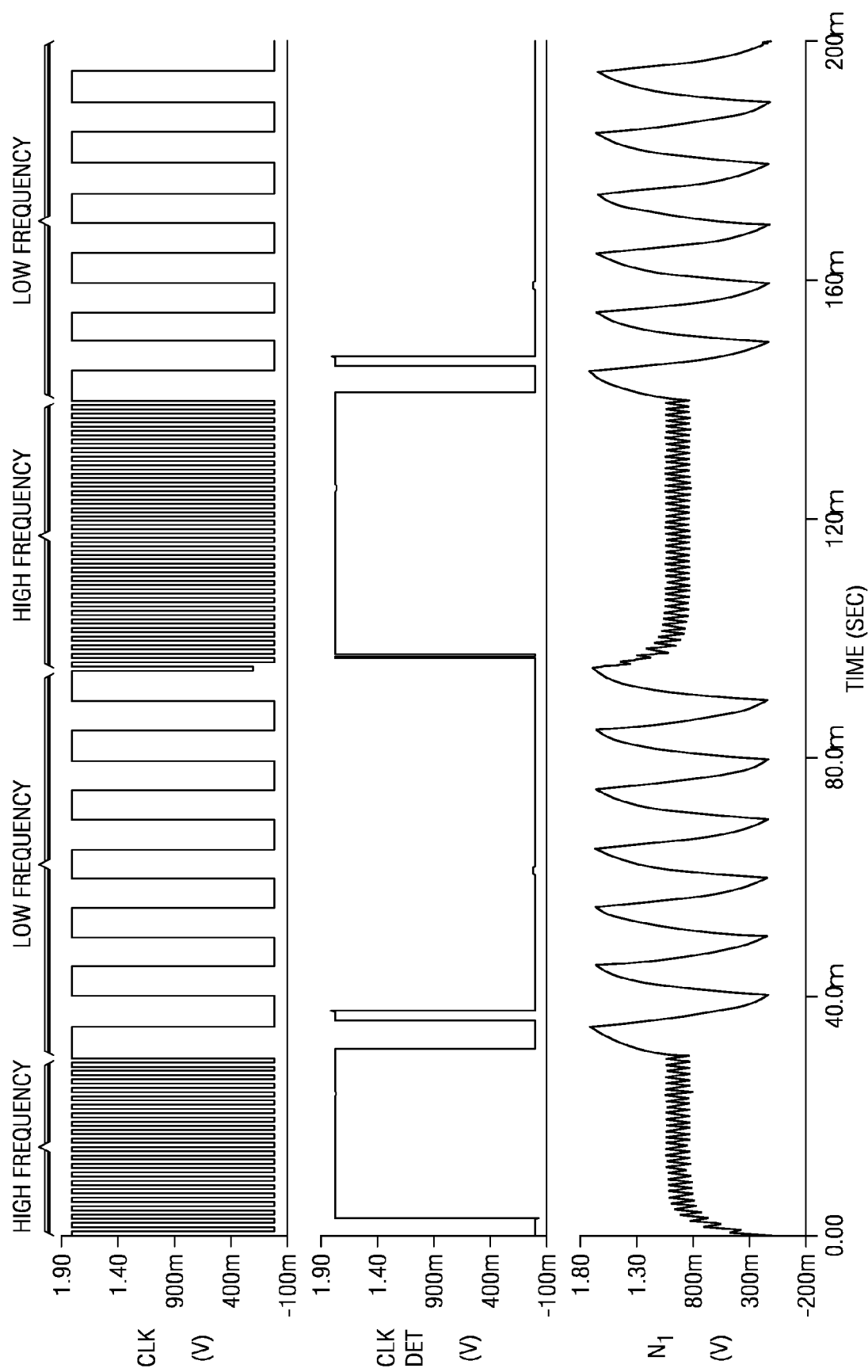
FIGS. 5-7 are a timing diagram of the general operation of the passive clock detector of FIG. 1.
Figure 6:
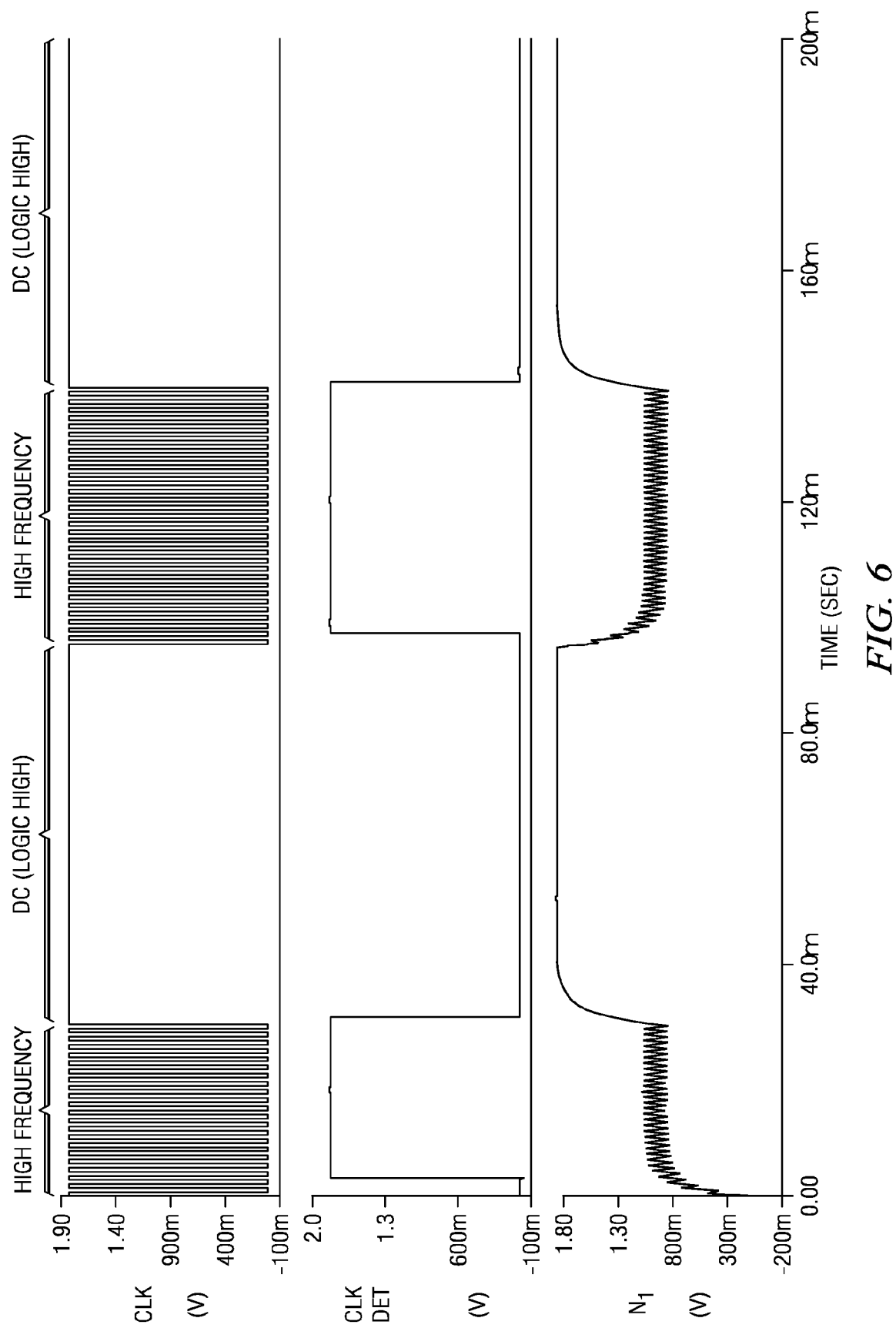
Figure 7:
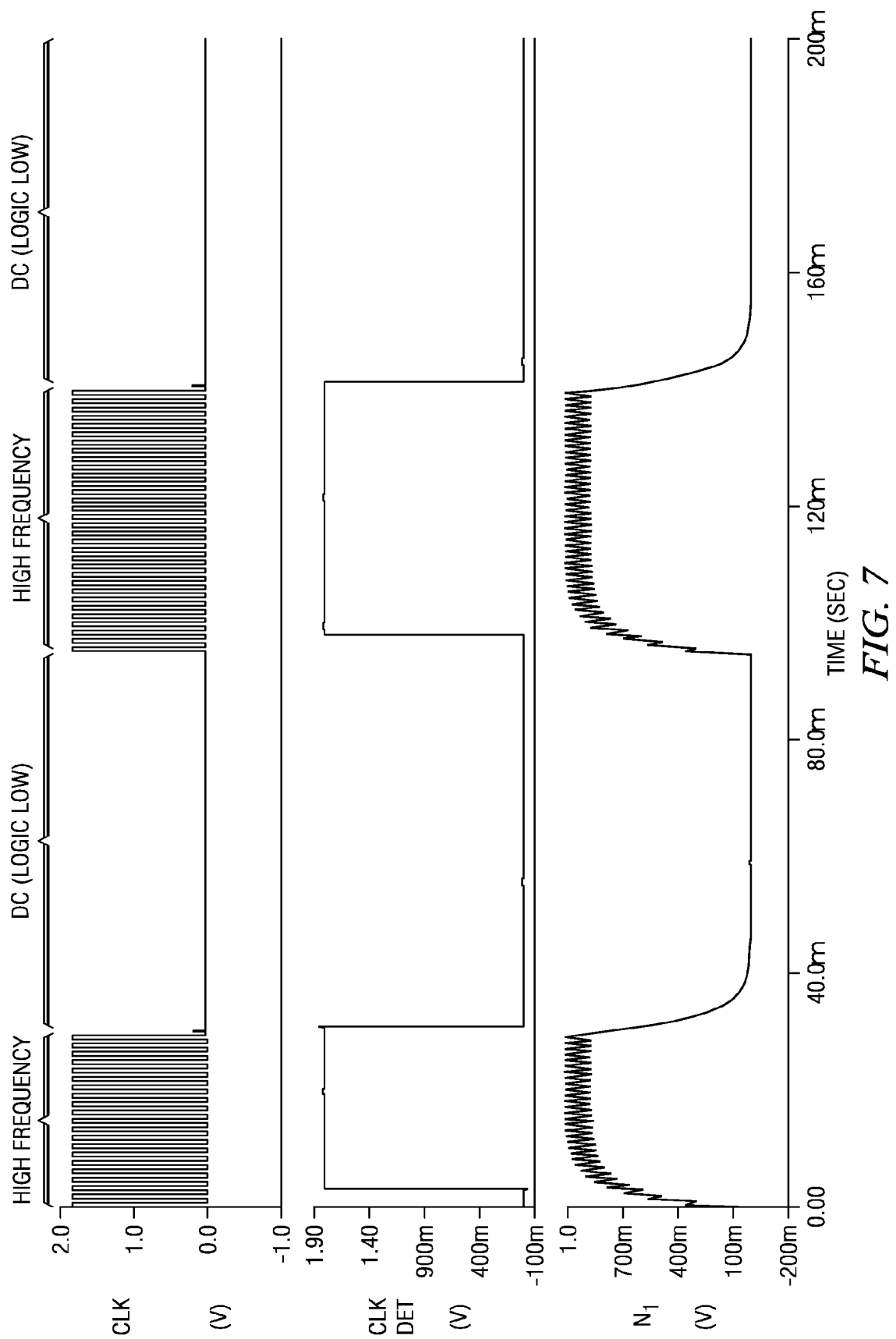

Each of FIGS. 5-7 depict difference cases of transition of a clock signal between its desired operating frequency or high frequency and various "sleep mode" states. FIG. 5 depicts outputs at node $N_1$ and the clock detection signal CLKDET as the clock signal transitions between high frequency (desired operating frequency) and a low frequency (sleep mode). FIG. 6 depicts outputs at node $N_1$ and the clock detection signal CLKDET as the clock signal transitions between high frequency (desired operating frequency) and a DC-logic high (sleep mode). FIG. 6 depicts outputs at node $N_1$ and the clock detection signal CLKDET as the clock signal transitions between high frequency (desired operating frequency) and a DC-logic low (sleep mode).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a filter that is adapted to receive a clock signal;
   a first branch that is coupled to the filter, wherein the first branch includes a low threshold inverter;
   a second branch that is coupled to the filter, wherein the second branch includes a high threshold inverter;
   a latch that is adapted to receive the clock signal and that is coupled to the first branch; and
   logic that is coupled to the node between the first branch and the latch, an output of the latch, and the second branch, wherein the logic is adapted to output a clock detection signal.

2. The apparatus of claim 1, wherein the filter further comprises a low pass filter.

3. The apparatus of claim 1, wherein the low threshold inverter further comprises:
   a PMOS FET having an aspect ratio of 0.8/4, wherein the PMOS FET is adapted to receives an input at its gate and to provide an output at its drain; and
   an NMOS FET having an aspect ratio of 4/0.4, wherein the gate of the NMOS FET is coupled to the gate of the PMOS FET, and wherein the drain of the NMOS FET is coupled to the drain of the PMOS FET.

4. The apparatus of claim 1, wherein the high threshold inverter further comprises:
   a PMOS FET having an aspect ratio of 8/0.4, wherein the PMOS FET is adapted to receives an input at its gate and to provide an output at its drain; and
   an NMOS FET having an aspect ratio of 0.8/4, wherein the gate of the NMOS FET is coupled to the gate of the PMOS FET, and wherein the drain of the NMOS FET is coupled to the drain of the PMOS FET.

5. The apparatus of claim 1, wherein the first branch includes a delay circuit that is coupled between the low threshold inverter and the latch.

6. The apparatus of claim 1, wherein the latch further comprises a D flip-flop.

7. The apparatus of claim 1, wherein the logic further comprises an AND gate.

8. An apparatus comprising:
   a low pass filter that is adapted to receive a clock signal;
   a low threshold inverter that is coupled to the filter;
   a delay circuit that is coupled to the low threshold inverter;
   a high threshold inverter that is coupled the filter;
   a latch that is adapted to receive the clock signal and that is coupled to the delay circuit; and
   logic that is coupled to an output of the latch, the delay circuit, and the high threshold inverter, wherein the logic is adapted to output a clock detection signal.

9. The apparatus of claim 8, wherein the low pass filter further comprises:
   a resistor having a value of about 2 MΩ that is adapted to receive the clock signal; and
   a capacitor that is coupled between the resistor and ground, wherein the capacitor has a value of about 1 pF.

10. The apparatus of claim 8, wherein the low threshold inverter further comprises:
   a PMOS FET having an aspect ratio of 0.8/4, wherein the PMOS FET is adapted to receives an input at its gate and to provide an output at its drain; and
   an NMOS FET having an aspect ratio of 4/0.4, wherein the gate of the NMOS FET is coupled to the gate of the PMOS FET, and wherein the drain of the NMOS FET is coupled to the drain of the PMOS FET.

11. The apparatus of claim 8, wherein the high threshold inverter further comprises:
- a PMOS FET having an aspect ratio of 8/0.4, wherein the PMOS FET is adapted to receives an input at its gate and to provide an output at its drain; and
- an NMOS FET having an aspect ratio of 0.8/4, wherein the gate of the NMOS FET is coupled to the gate of the PMOS FET, and wherein the drain of the NMOS FET is coupled to the drain of the PMOS FET.

12. The apparatus of claim 8, wherein the delay circuit further comprises a plurality of inverters coupled in series with one another.

13. The apparatus of claim 8, wherein the latch further comprises a D flip-flop.

14. The apparatus of claim 9, wherein the logic further comprises an AND gate.

* * * * *